(12) United States Patent
Sulfridge et al.

(10) Patent No.: US 9,998,643 B2
(45) Date of Patent: Jun. 12, 2018

(54) METHODS OF FORMING CURVED IMAGE SENSORS

(71) Applicant: SEMICONDUCTOR COMPONENTS INDUSTRIES, LLC, Phoenix, AZ (US)

(72) Inventors: Marc Allen Sulfridge, Boise, ID (US); Andrew Eugene Perkins, Boise, ID (US); Rickie Charles Lake, Meridian, ID (US); Jonathan Michael Stern, San Carlos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 403 days.

(21) Appl. No.: 14/667,457

(22) Filed: Mar. 24, 2015

(65) Prior Publication Data

US 2016/0286102 A1   Sep. 29, 2016

(51) Int. Cl.
*H01L 21/00* (2006.01)
*H04N 5/225* (2006.01)
*B29C 65/00* (2006.01)

(52) U.S. Cl.
CPC ......... *H04N 5/2253* (2013.01); *B29C 66/345* (2013.01); *B29C 66/81455* (2013.01); *B29C 66/8266* (2013.01); *H01L 21/00* (2013.01)

(58) Field of Classification Search
None
See application file for complete search history.

(56) References Cited

U.S. PATENT DOCUMENTS

| 4,541,891 | A | * | 9/1985 | Leatherman | B29C 43/56 156/272.4 |
|---|---|---|---|---|---|
| 5,562,796 | A | * | 10/1996 | Ertel | B29C 65/18 100/258 A |
| 5,964,978 | A | * | 10/1999 | Hirooka | B24B 37/04 156/285 |
| 6,791,072 | B1 | | 9/2004 | Prabhu | |

(Continued)

FOREIGN PATENT DOCUMENTS

| JP | 2005045151 A | * | 2/2005 |
| JP | 2012182194 A | | 9/2012 |

OTHER PUBLICATIONS

Machine translation of JP 2005-045151A, Apr. 3, 2017.*

*Primary Examiner* — Barbara J Musser
(74) *Attorney, Agent, or Firm* — Treyz Law Group, P.C.; Joseph F. Guihan

(57) ABSTRACT

A method for forming curved image sensors may include applying positive pressure to the face of an image sensor, forcing the image sensor to adhere the curved surface of a substrate. The pressure may be applied to the face of the image sensor in a variety of ways, including using pneumatic pressure, hydraulic pressure, or pressure from an elastic or inelastic solid. Processing may occur on either a single image sensor die or an image sensor wafer. When an image sensor wafer is processed, a substrate may be used that has a number of cavities defined by respective curved surfaces with each cavity corresponding to a respective image sensor. When pressure is applied to the image sensor, the image sensor may deform until the curvature of the image sensor matches the curvature of the curved surface of the underlying substrate.

11 Claims, 5 Drawing Sheets

(56) References Cited

U.S. PATENT DOCUMENTS

| | | | | |
|---|---|---|---|---|
| 7,285,897 B2* | 10/2007 | Fisher | ................ | G01N 29/2406 |
| | | | | 257/E27.006 |
| 7,397,066 B2 | 7/2008 | Oliver | | |
| 2004/0194880 A1* | 10/2004 | Jiang | ....................... | B29C 63/16 |
| | | | | 351/159.57 |
| 2007/0195262 A1* | 8/2007 | Mosse | ................ | B29C 63/0073 |
| | | | | 351/159.56 |
| 2009/0115875 A1* | 5/2009 | Choi | ................ | H01L 27/14618 |
| | | | | 348/294 |
| 2012/0005993 A1* | 1/2012 | Doll | .................... | B29C 66/0042 |
| | | | | 53/477 |
| 2012/0080142 A1* | 4/2012 | Kulik | .................. | B29C 33/405 |
| | | | | 156/213 |
| 2016/0150131 A1* | 5/2016 | Toc | ...................... | H04N 5/2253 |
| | | | | 348/373 |

\* cited by examiner

METHODS OF FORMING CURVED IMAGE SENSORS

BACKGROUND

This relates generally to imaging systems and, more particularly, to imaging systems having curved image sensors.

Modern electronic devices such as cellular telephones, cameras, and computers often use camera modules with digital image sensors. Imagers (i.e., image sensors) often include a two-dimensional array of image sensing pixels. Each pixel typically includes a photosensitive element such as a photodiode that receives incident photons (light) and converts the photons into electrical signals. Typically, image sensors are formed on a flat plane.

In one possible arrangement, a simple lens is used to focus image light onto the image sensing pixels. However, a simple lens generates a curved focal plane. This is problematic when focusing image light onto a flat image sensor, as applying the curved focal plane to a flat image sensor results in reduced image quality. To solve this problem, a multi-element lens is typically used to generate a flat focal plane. Using a multi-element lens to focus image light increases image quality for flat image sensors. However, these multi-element lenses are much more expensive than using a simple lens. Additionally, the multi-element lens results in the camera module having a greater z-height than otherwise necessary.

One way to reduce the complexity and size of lenses in a camera module is to use curved image sensors. A curved image sensor can be designed to match the curvature of a simple lens's curved focal plane. This reduces both the cost and height of the camera module. Curving an image sensor can also provide a performance advantage by decreasing the dark current generated by the image sensor. However, forming curved image sensors is difficult as the image sensors are very thin and therefore extremely fragile.

It would therefore be desirable to provide improved ways of forming curved image sensors.

DETAILED DESCRIPTION

Electronic devices such as digital cameras, computers, cellular telephones, and other electronic devices include image sensors that gather incoming image light to capture an image. An image sensor may include an array of imaging pixels. The imaging pixels may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
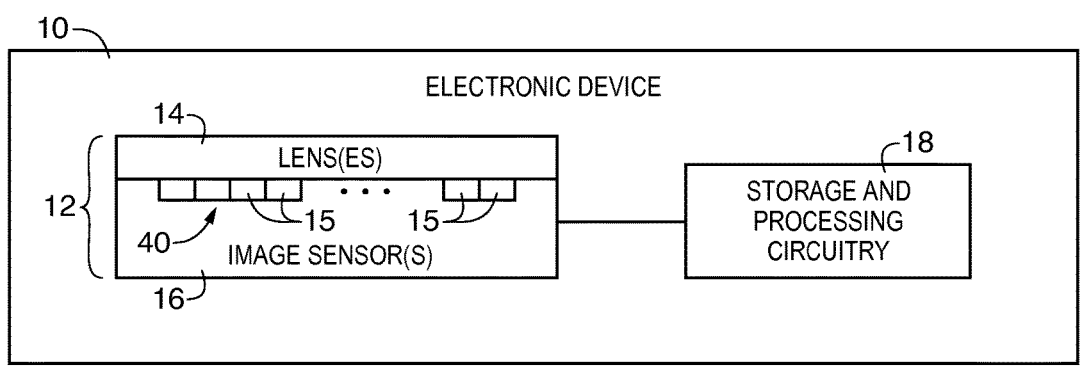
FIG. 1 is a diagram of an illustrative imaging system having a camera module that includes one or more image sensors in accordance with an embodiment of the present invention.

FIG. 1 is a diagram of an illustrative electronic device that uses one or more image sensors to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. If desired, camera module 12 may be provided with an array of lenses 14 and an array of corresponding image sensors 16. Each image sensor 16 may include an image pixel array 40 with an array of image sensor pixels 15. Image sensors 16 may include one or more backside illumination (BSI) image sensors and/or one or more front side illumination (FSI) image sensors.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
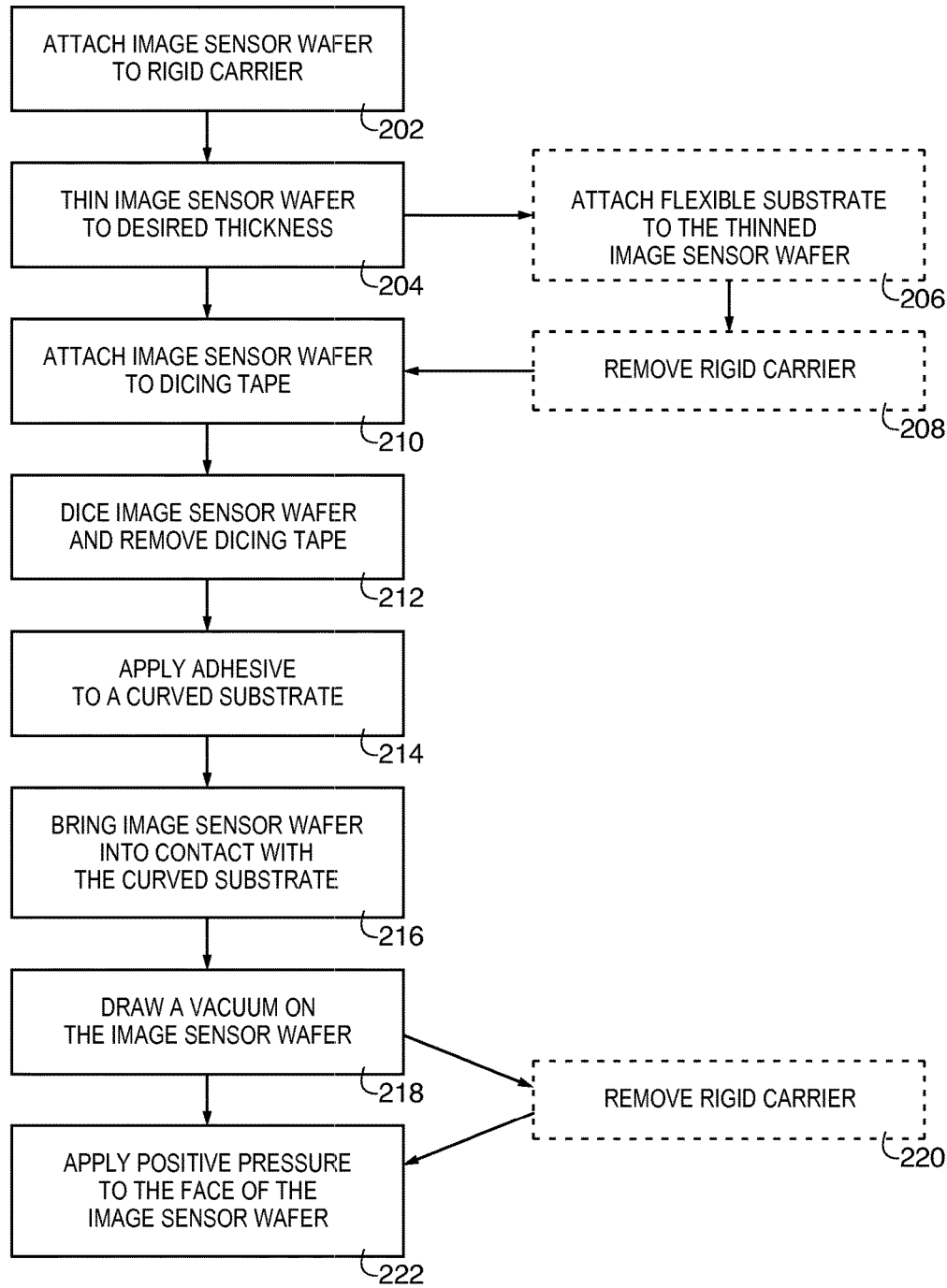
FIG. 2 is a flowchart of illustrative steps for forming curved image sensors in accordance with an embodiment of the present invention.

FIG. 2 is a flowchart of illustrative steps for forming curved image sensors. At step 202, an image sensor wafer may be attached to a rigid carrier. An image sensor wafer may contain multiple image sensor dies, with each image sensor die including an array of image sensor pixels operable to produce image data. An image sensor wafer may be diced after processing to form individual image sensor dies.

The rigid carrier may be used to provide structural support and hold the image sensor wafer in place during the thinning and dicing processes. The rigid carrier may be made of silicon, glass, or another desired rigid material.

The image sensor wafer may be temporarily attached to the rigid carrier. For example, the image sensor wafer may be bonded to the rigid carrier with a thermal release material. This thermal release material may have high adhesive strength throughout processing of the image sensor wafer.

When the rigid carrier is ready to be removed, the thermal release material may be heated to reduce the adhesive strength of the bond. The rigid carrier may then be removed from the image sensor wafer. This example of an attachment method is purely illustrative. The rigid carrier may be attached to the image sensor wafer using any desired methods.

At step 204, the image sensor wafer may be thinned to a desired thickness. Thinning of the image sensor wafer may be done by any suitable method (e.g., back grinding, polishing, wet etching, dry etching, etc.). The image sensor wafer may be thinned to a thickness of less than 10 μm, 10 μm, greater than 10 μm, greater than 50 μm, greater than 100 μm, or any other desired thickness. In general, a thinner image sensor wafer will be easier to curve. For this reason, it may be desirable to thin the image sensor wafer as much as possible while maintaining the structural integrity of the image sensor wafer.

In certain embodiments, a flexible substrate may be used to increase the robustness of the image sensor wafer. In these embodiments, the thinned image sensor wafer may be attached to a flexible substrate at step 206. The flexible substrate may increase the robustness of the image sensor wafer. The flexible substrate may reduce cracking and chipping in the thinned image sensor wafer during processing.

When a flexible substrate is used, the rigid carrier may be removed from the image sensor wafer at step 208. The image sensor wafer and rigid carrier may be separated using any desired means. In certain embodiments where the image sensor wafer and rigid carrier are attached using a thermal release material, the image sensor wafer may be heated or cooled before the rigid carrier is removed. However, this example is purely illustrative.

At step 210, the image sensor wafer may be attached to dicing tape. In embodiments where a flexible substrate is used, this step may occur after steps 206 and 208. In embodiments where a flexible substrate is not used, this step may occur directly after step 204. The dicing tape may be, for example, an ultraviolet (UV) releasable dicing tape. The UV dicing tape may have high adhesive strength until it is exposed to UV light. After being exposed to the UV light, the UV dicing tape may have reduced adhesive strength and be easier to remove. This example is purely illustrative, and any desired dicing tape may be used at step 210.

At step 212, the image sensor wafer may be completely or partially diced. In embodiments where the image sensor wafer is completely diced, both the image sensor wafer and carrier substrate (e.g., rigid carrier or flexible substrate) may be completely cut as to separate each image sensor die. Alternatively, the image sensor wafer may be partially diced. In these embodiments, the image sensor wafer may be cut without cutting the carrier substrate. In this way, the image sensor dies may be separated but will remain attached to a single, uncut carrier substrate. When the image sensor wafer is completely diced at step 212, the remaining processing may occur with equipment designed to curve each image sensor die individually. When the image sensor wafer is partially diced at step 212, the remaining processing may occur with equipment designed to simultaneously curve each image sensor die in an image sensor wafer. In certain cases, the image sensor wafer may be partially diced at step 212 and then a subset of the image sensor wafer completely separated from the rest of the wafer. In this way, multiple image sensor dies may be processed simultaneously without necessarily having to process the entire wafer at once.

Also at step 212, the dicing tape may be removed. In embodiments where a UV releasable dicing tape is used, UV light may be used to reduce the adhesive strength of the dicing tape. The dicing tape may then be removed using any desired method.

At step 214, adhesive may be applied to a curved substrate. The curved substrate may be made of glass, ceramic, silicon, polymers, plastic, or any other desired material. The curved substrate should be rigid so that it does not easily deform during the curving process. At step 214, adhesive may be applied to the entire curved surface of the curved substrate. Alternatively, adhesive may be applied to only portions of the curved surface of the curved substrate. In yet another embodiment, adhesive may not be applied to the curve substrate at all. Instead, adhesive may be applied to only the image sensor wafer. Adhesive may be applied to both the curved surface of the curved substrate and the image sensor wafer. The adhesive may be applied to the curved substrate or image sensor wafer using any desired method. For example, the adhesive may be sprayed or painted on to the curved substrate or image sensor wafer. In other embodiments, the adhesive may be a dry film that is disposed on the curved substrate or the image sensor wafer. The curved substrate may have one or more curved cavities that each has the desired curvature for a processed image sensor.

At step 216, the image sensor wafer may be brought into contact with the curved substrate. The image sensor wafer may be aligned such that the center of the image sensor is positioned directly over the center of the curved surface of the curved substrate. However, this need not be the case and the image sensor wafer can be aligned in any desired manner.

At step 218, a vacuum may be drawn at the backside of the image sensor wafer. The vacuum may hold the image sensor wafer in place for subsequent processing as well as contribute to the force needed to curve the image sensor. Additionally, the vacuum may ensure that no air is trapped in the bond-line.

In embodiments where a flexible substrate is not used, the rigid carrier may be removed at step 220. The rigid carrier may be removed using any desired methods. In certain embodiments where the image sensor wafer and rigid carrier are attached using a thermal release material, the image sensor wafer may be heated or cooled to remove the rigid carrier. However, this example is purely illustrative.

At step 222, a positive pressure may be applied to the face of the image sensor wafer. This positive pressure may serve to deform the image sensor wafer. The image sensor wafer may be pressured until the surface of the image sensor wafer conforms to the curved surface of the curved substrate. The positive pressure may be applied using any desired means. In various embodiments, pneumatic pressure, hydraulic pressure, and pressure from an elastic or inelastic solid may all be used to apply pressure to the face of the image sensor wafer. Any desired amount of pressure may be applied to the face of the image sensor wafer (e.g., greater than 1 atmosphere, greater than 20 atmospheres, greater than 100 atmospheres, or greater than 400 atmospheres).

In the previous descriptions of steps 214, 216, 218, 220, and 222, the processing of an image sensor wafer was discussed. However, as mentioned in the description of 212, in certain embodiments the image sensor wafer may be completely diced into individual image sensor dies. Steps 214, 216, 218, 220, and 222 may be performed either on an image sensor wafer or an individual sensor die. Similarly, the following figures and descriptions will show various methods of applying pressure to the face of an image sensor die. However, these methods may also be applied to processing an entire image sensor wafer or a portion of an image sensor wafer, with the relevant processing equipment merely being expanded to accommodate an image sensor wafer or subset of an image sensor wafer of a desired size instead of an individual image sensor die.

Figure 3:
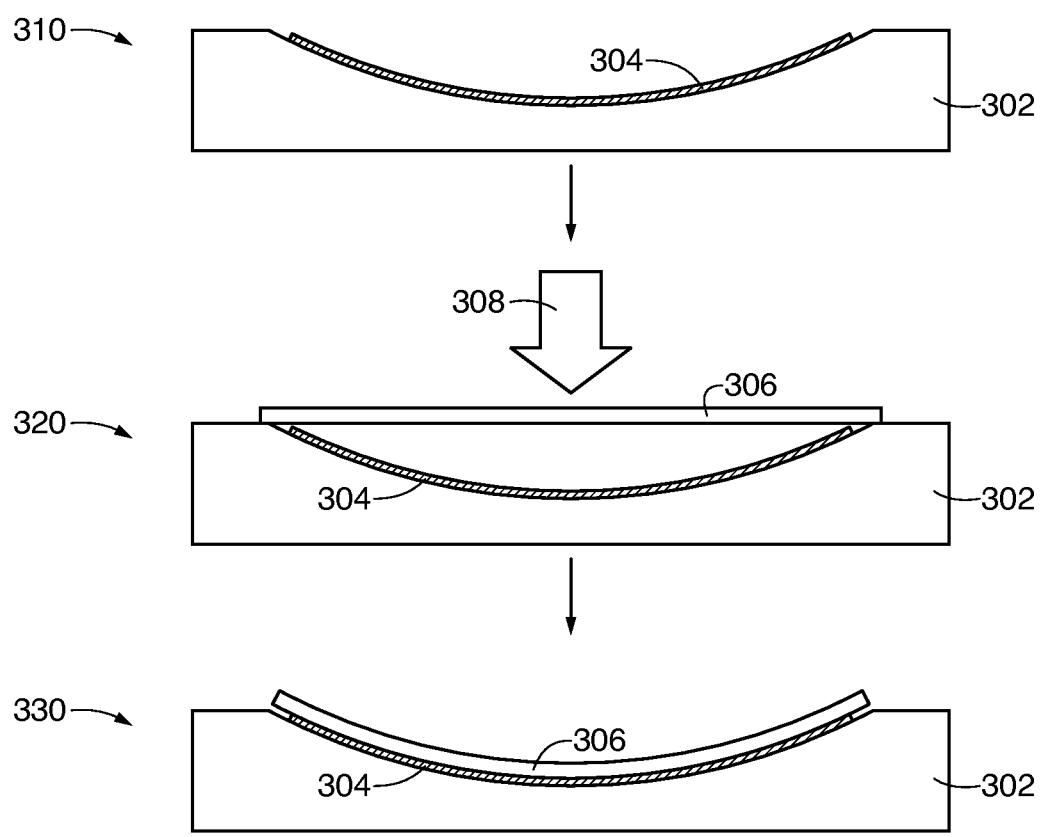
FIG. 3 is a cross-sectional diagram of an illustrative method for forming curved image sensors in accordance with an embodiment of the present invention.

FIG. 3 cross-sectional diagram of an illustrative method for forming curved image sensor dies. At step 310, curved substrate 302 coated with adhesive 304 may be provided. The curved substrate shown in FIG. 3 has a uniform curvature. However, this example is purely illustrative. Curved substrate 302 may have uniform curvature or non-uniform curvature. In certain cases, the edges of an image sensor may include wire bonding or some other form of interconnections with which to connect to a circuit board. Thus, the image sensor may include bond pads at the edges of the image sensor. An extreme curvature may result in a surface that is too sloped to apply bond pads to the image sensor using typical means. To avoid this problem, curved substrate 302 may have a non-uniform curvature with a less curved section at the periphery of the curved surface. In general, the curved substrate may have a curved surface with any desired curvature or combinations of curvatures. In embodiments where an image sensor wafer is processed, the curved substrate may have a plurality of cavities defined by curved surfaces. Each cavity may have completely uniform, partially uniform, or non-uniform curvature. Each cavity may have the same curvature or different curvature than the other cavities.

At step 320, image sensor die 306 may be positioned above the curved surface of curved substrate 302. Image sensor die 306 may then receive positive pressure 308 which deforms the image sensor die. At step 330, image sensor die 306 has successfully been deformed to match the curvature of curved substrate 302. Adhesive 304 may secure image sensor die 306 in the curved position to ensure that image sensor die 306 does not lose the desired shape.

In some embodiments, adhesive 304 may be an ultraviolet (UV) light activated adhesive. UV light activated adhesive may be cured by the application of UV light. For example, adhesive 304 may be uncured at step 310 before image sensor die 306 has been applied. At step 330, once adhesive 304 is in contact with image sensor die 306, adhesive 304 may be exposed to UV light. Exposing adhesive 304 to UV light may cause adhesive 304 to cure and adhere image sensor die 306 to curved substrate 302. In these embodiments, it may be desirable for curved substrate 302 to be transparent to UV light.

In embodiments where adhesive 304 is a UV light activated adhesive, it may be advantageous for curved substrate 302 to be substantially transparent to UV light. Curved substrate 302 may be made of any desired material that is substantially transparent to UV light such as glass, sapphire, plastic, quartz, diamond, etc. These examples are purely illustrative, and curved substrate 302 does not necessarily have to be made of material that is transparent to UV light.

In certain embodiments where adhesive 304 is a UV light activated adhesive and curved substrate 302 is substantially transparent to UV light, UV light may be passed through the backside of curved substrate 302 to cure adhesive 304. For example, UV light may pass through the backside of curved substrate 302 at step 330 of FIG. 3. Adhesive 304 may be cured while positive pressure 308 is forcing image sensor die 306 into contact with adhesive 304. The aforementioned examples of adhesive 304 being a UV light activated adhesive are purely illustrative. Adhesive 304 may be any type of adhesive such as a pressure sensitive adhesive (PSA), a liquid cured adhesive, a temperature sensitive adhesive, or any other desired type of adhesive.

Figure 4:
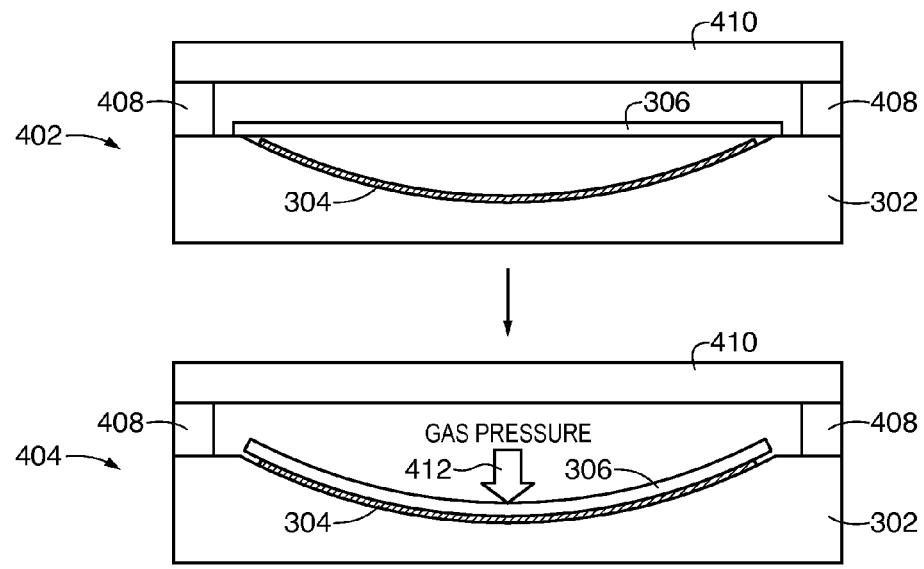
FIG. 4 is a cross-sectional diagram of an illustrative method for applying positive pressure to the face of an image sensor using pneumatic pressure in accordance with an embodiment of the present invention.

There are a number of ways to apply positive pressure 308 to the face of image sensor die 306. FIG. 4 is a cross-sectional diagram of an illustrative method for applying positive pressure to the face of an image sensor using pneumatic pressure. At step 402, image sensor 306 may be positioned above the curved surface of curved substrate 302. Adhesive 304 may coat the curved surface of curved substrate 302. Peripheral structure 408 and lid 410 may form an enclosed area surrounding image sensor 306.

At step 404, the enclosure formed by image sensor 306, peripheral structure 408, and lid 410 may be pressurized with gas. Lid 410 and peripheral structure 408 may be made from any desired material. Lid 410 and 408 may have the strength to withstand the pressure from the gas without deforming. As the enclosure is pressurized, image sensor die 306 is deformed by gas pressure 412 and conforms to the curved surface of curved substrate 302. Any desired gas may be used to pressurize the enclosure (e.g., nitrogen, clean dry air (CDA), etc.).

Figure 5:
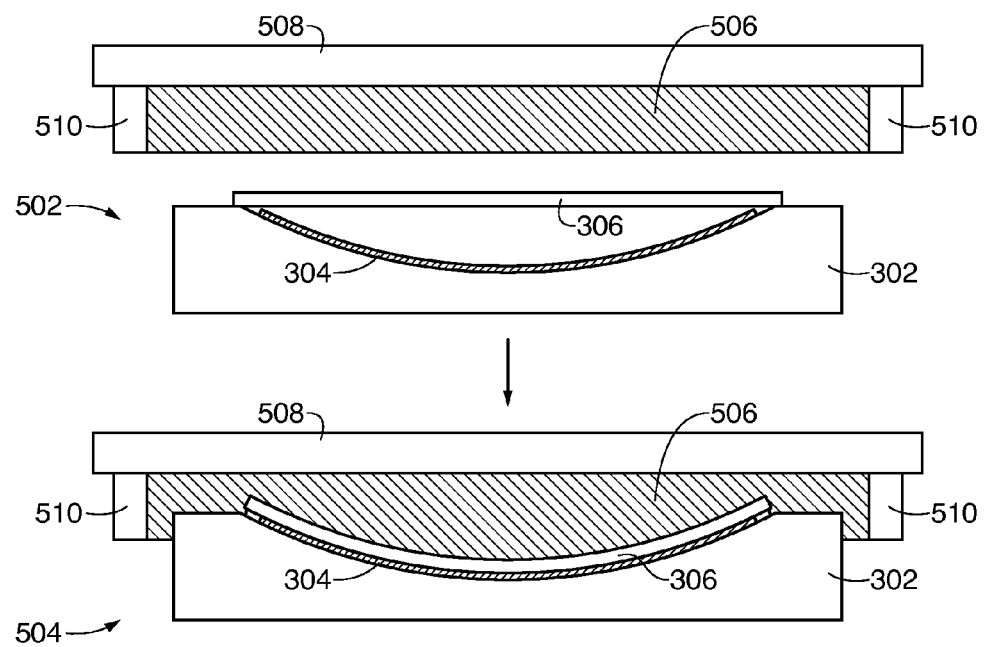
FIG. 5 is a cross-sectional diagram of an illustrative method for applying positive pressure to the face of an image sensor using hydraulic pressure in accordance with an embodiment of the present invention.

FIG. 5 is a cross-sectional diagram of an illustrative method for applying positive pressure to the face of an image sensor using hydraulic pressure. At step 502, image sensor 306 may be positioned above the curved surface of curved substrate 302. Adhesive 304 may coat the curved surface of curved substrate 302. Bladder 506 may be positioned above image sensor die 306. Bladder 506 may be attached to support structure 508. Bladder 506 may be a flexible bag that is filled with fluid. The flexible bag may be made from any desired material. The flexible bag may be made, for example, from silicone rubber. Any desired fluid may fill bladder 506. For example, bladder 506 may be filled with oil or water. Bladder 506 may be surrounded by rigid peripheral structure 510. Rigid peripheral structure 510 may be, for example, a collet.

At step 504, bladder 506 is lowered to contact image sensor 306. Bladder 506 may initially contain no fluid, be partially full of fluid, or be completely full of fluid. Once in contact with image sensor 306, bladder 506 may be filled with fluid such that an outward pressure is applied to the surface of image sensor 306. Rigid peripheral structure 510 may ensure that the force from bladder 506 is directed downwards towards the face of the image sensor. The flexible bag of bladder 506 will allow the pressure to be applied to the surface of image sensor 306 and force the image sensor to deform. The bladder may continue to apply pressure until image sensor 306 is adhered to the curved surface of curved substrate 302.

Figure 6:
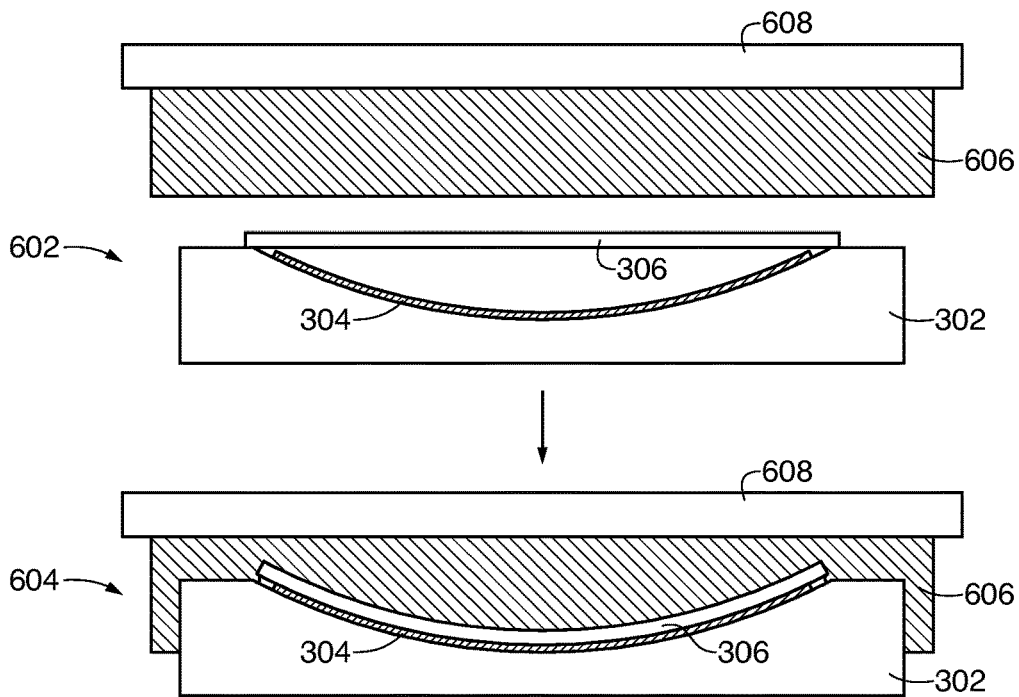
FIG. 6 is a cross-sectional diagram of an illustrative method for applying positive pressure to the face of an image sensor using elastic pressure in accordance with an embodiment of the present invention.

FIG. 6 is a cross-sectional diagram of an illustrative method for applying positive pressure to the face of an image sensor using elastic pressure in accordance with an embodiment of the present invention. At step 602, image sensor 306 may be positioned above the curved surface of curved substrate 302. Adhesive 304 may coat the curved surface of curved substrate 302. Deformable solid 606 may be positioned above image sensor die 306. Deformable solid 606 may be attached to support structure 608. Deformable solid 606 may be made of any desired material such as, for example, silicone rubber.

At step 604, deformable solid 606 may be lowered to contact image sensor 306. Once in contact with image sensor 306, the flexibility of deformable solid 606 will allow pressure to be applied to the surface of image sensor 306 and force the image sensor to deform. Support structure 608 may continue to be lowered until the surface of image sensor 306 conforms to the curvature of curved substrate 302. The deformable solid may continue to apply pressure until image sensor 306 is adhered to the curved surface of curved substrate 302. Support structure 608 may be lowered using any desired method and equipment (e.g., press, hydraulic press, mechanical press, pneumatic press, etc.).

Figure 7:
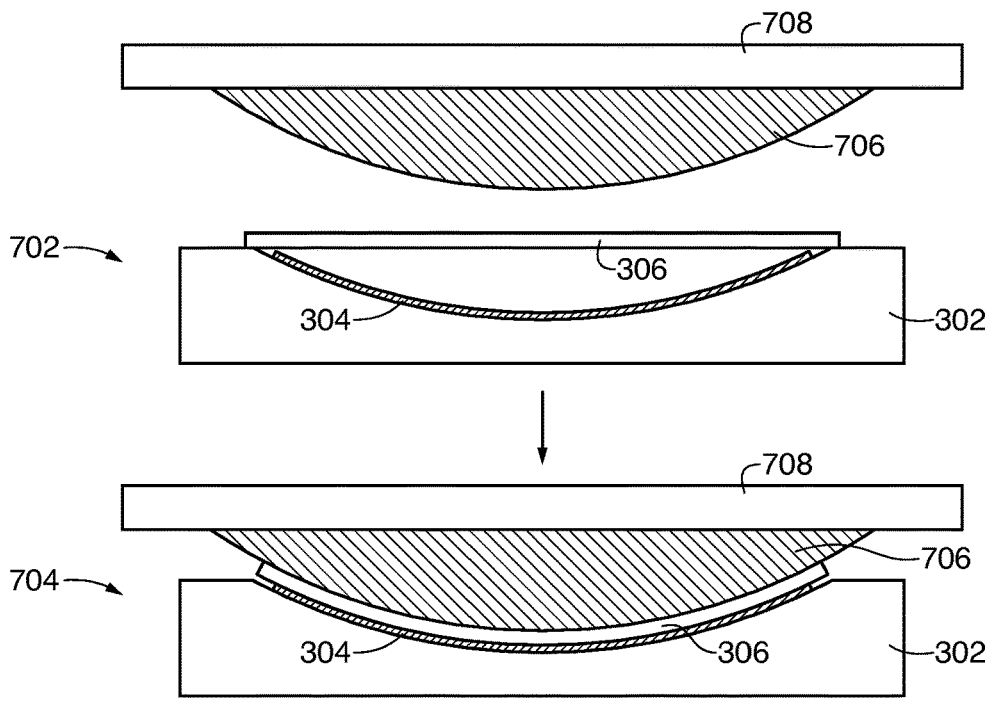
FIG. 7 is a cross-sectional diagram of an illustrative method for applying positive pressure to the face of an image sensor using inelastic pressure in accordance with an embodiment of the present invention.

FIG. 7 is a cross-sectional diagram of an illustrative method for applying positive pressure to the face of an image sensor using inelastic pressure. At step 702, image sensor 306 may be positioned above the curved surface of curved substrate 302. Adhesive 304 may coat the curved surface of curved substrate 302. Rigid solid 706 may be attached to support structure to support structure 708. Rigid solid 706 may be positioned above the surface of image sensor 306. Rigid solid 706 may be made of any material that will not deform when forced into the surface of image sensor die 306. Rigid solid 706 may, for example, be made of glass, ceramic, silicon, polymers, plastic, or any other desired material. The curvature of rigid solid 706 may match the curvature of curved substrate 302. FIG. 7 shows rigid solid 706 having one protruding curved portion corresponding to one cavity defined by a curved surface in substrate 302. However, this example is purely illustrative. In embodiments where an image sensor wafer is processed, rigid solid 706 may include a number of protruding curved portions with each protrusion corresponding to a cavity in substrate 302. Rigid solid 706 may be coated with a thin layer of elastic material such as silicone rubber. This may help protect the image sensor die from being damaged during the curving process while ensuring that rigid solid maintains sufficient rigidity to deform the image sensor.

At step 704, rigid solid 706 may be lowered to contact image sensor 306. As rigid solid 706 is lowered, the surface of image sensor 306 is deformed to match the curvature of rigid solid 706 and curved substrate 302. The rigid solid may continue to apply pressure until image sensor 306 is adhered to the curved surface of curved substrate 302.

Various embodiments have been described for forming a curved image sensor. In certain embodiments, adhesive may be applied to the curved surface of a substrate. An image sensor may then be positioned above the curved surface of the substrate. Pressure may be applied to the image sensor so that the image sensor deforms and adheres to the curved surface of the substrate. Applying pressure to the image sensor may include forming an enclosure around the image sensor and pressurizing the enclosure with gas such as nitrogen or clean dry air. Applying pressure to the image sensor may include lowering a bladder into contact with the image sensor and filling the bladder with fluid. The bladder may be made of silicone rubber. The bladder may be at least partially surrounded by a rigid peripheral structure. Applying pressure to the image sensor may include pushing on the surface of the image sensor with a deformable solid such as silicone rubber. Applying pressure to the image sensor may include pushing on the surface of the image sensor with a rigid solid. The rigid solid may have a curved surface with curvature that matches curvature of the curved surface of the substrate. The rigid solid may be made of glass. The curved surface of the substrate may have completely uniform curvature, partially uniform curvature, or non-uniform curvature. The substrate may include glass. Applying pressure to the image sensor may include deforming the image sensor so that the image sensor has a curved surface with curvature that matches curvature of the curved surface of the substrate.

In various embodiments, an image sensor wafer with first and second opposing surfaces may be positioned above a substrate. The image sensor wafer may include a plurality of image sensors. The substrate may include a plurality of cavities defined by respective curved surfaces. Each image sensor may correspond to a respective curved surface of the plurality of cavities. Pressure may be applied to the first surface of the image sensor wafer so that the second surface of the image sensor wafer is biased towards the substrate. Applying pressure to the first surface of the image sensor wafer may include lowering a bladder into contact with the image sensor wafer and filling the bladder with a fluid. Applying pressure to the image sensor wafer may include forming an enclosure around the image sensor wafer and pressurizing the enclosure with gas. Applying pressure to the image sensor wafer may include pushing on the first surface of the image sensor wafer with a deformable solid. Applying pressure to the first surface of the image sensor wafer may include pushing on the first surface of the image sensor wafer with a rigid solid. The rigid solid may include a plurality of protruding curved portions. Each protruding curved portion may correspond to a respective curved surface of the plurality of cavities. Each protruding curved portion may have curvature that matches curvature of each respective curved surface of the plurality of cavities.

The foregoing is merely illustrative of the principles of this invention and various modifications can be made by those skilled in the art. The foregoing embodiments may be implemented individually or in any combination.

What is claimed is:

1. A method of forming a curved image sensor, the method comprising:
   applying adhesive to a curved surface of a substrate;
   positioning an image sensor above the curved surface of the substrate;
   forming an enclosure around the image sensor; and
   applying pressure to the image sensor so that the image sensor deforms and adheres to the curved surface, wherein applying pressure to the image sensor comprises pressurizing the enclosure with gas, and wherein the gas applies the pressure directly to the image sensor without any intervening structures.

2. The method defined in claim 1, wherein the gas is a gas selected from the group consisting of: nitrogen and clean dry air (CDA).

3. The method defined in claim 1, wherein the curved surface of the substrate has completely uniform curvature.

4. The method defined in claim 1, wherein the curved surface of the substrate has non-uniform curvature.

5. The method defined in claim 4, wherein the curved surface of the substrate has a periphery that surrounds a central portion and wherein the curved surface is less curved at the periphery than at the central portion.

6. The method defined in claim 1, wherein the substrate comprises glass and the glass forms the curved surface of the substrate.

7. The method defined in claim 6, wherein the adhesive is an ultraviolet light activated adhesive, the method further comprising:
   while applying pressure to the image sensor, exposing the ultraviolet light activated adhesive to ultraviolet light through the glass.

8. The method defined in claim 1, wherein applying pressure to the image sensor so that the image sensor deforms and adheres to the curved surface comprises applying pressure to the image sensor so that the image sensor has a curved surface with curvature that matches curvature of the curved surface of the substrate.

9. The method defined in claim 1, wherein the gas is clean dry air (CDA).

10. The method defined in claim 1, wherein forming the enclosure around the image sensor comprises forming a peripheral structure on a periphery of the substrate and attaching a lid to the peripheral structure.

11. The method defined in claim 10, wherein forming the peripheral structure on the periphery of the substrate comprises forming the peripheral structure on a planar surface of the substrate.

* * * * *